United States Patent [19]

Sugita et al.

[11] Patent Number: 5,218,979
[45] Date of Patent: Jun. 15, 1993

[54] METHOD OF CLEANING PRINTED CIRCUIT BOARDS WITH DIMETHYLCYCLOOCTADIENES

[75] Inventors: Masaru Sugita; Yoshiaki Horiuchi; Shinichiro Shiozu, all of Osaka; Hideo Horii, Tama; Katsumi Omura; Noriaki Kumagai, both of Kashima, all of Japan

[73] Assignees: Nagase & Company, Ltd., Osaka; Kuraray Co., Ltd., Okayama, both of Japan

[21] Appl. No.: 820,223

[22] Filed: Jan. 14, 1992

Related U.S. Application Data

[62] Division of Ser. No. 578,301, Sep. 5, 1990, Pat. No. 5,132,039.

[30] Foreign Application Priority Data

Sep. 5, 1989 [JP] Japan ................................ 1-229878

[51] Int. Cl.$^5$ ............................................. C23G 5/02
[52] U.S. Cl. ............................................ 134/2; 134/26; 134/40; 134/42; 252/162
[58] Field of Search ................... 134/2, 26, 38, 40, 42; 252/162, 172

[56] References Cited

U.S. PATENT DOCUMENTS

| | | | |
|---|---|---|---|
| 3,886,099 | 5/1975 | Hall | 134/42 X |
| 4,524,011 | 6/1985 | Tasset et al. | 134/42 X |
| 4,597,890 | 7/1986 | Dallessandro et al. | 134/40 X |
| 4,863,630 | 9/1989 | Swan et al. | 252/162 X |
| 4,983,224 | 1/1991 | Mombrun et al. | 134/40 |

FOREIGN PATENT DOCUMENTS

| | | |
|---|---|---|
| 0116343 | 8/1984 | European Pat. Off. |
| 0351810 | 1/1990 | European Pat. Off. |
| 2046292 | 11/1980 | United Kingdom |

*Primary Examiner*—Theodore Morris
*Assistant Examiner*—Saeed T. Chaudhry
*Attorney, Agent, or Firm*—Wenderoth, Lind & Ponack

[57] ABSTRACT

A cleaning composition which comprises dimethylcyclooctadienes is disclosed. There is further disclosed a method of cleaning printed circuit boards or printed wiring boards, which comprises: contacting the board with a composition comprising dimethylcyclooctadienes and 2–20% by weight of a surfactant; rinsing the board with water; and drying the board.

4 Claims, No Drawings.

METHOD OF CLEANING PRINTED CIRCUIT BOARDS WITH DIMETHYLCYCLOOCTADIENES

This is a Rule 60 Divisional of Ser. No. 07/578,301 filed Sep. 5, 1990 U.S. Pat. No. 5,132,039.

This invention relates to a novel cleaning composition and application thereof, and more particularly it relates to a cleaning composition suitable for use in cleaning printed circuit or printed wiring boards to remove soldering fluxes therefrom during the fabrication of the boards.

There have recently been proposed a variety of cleaning compositions which contain terpenes of eight carbons. For instance, a water based cleaning composition is disclosed in Japanese Patent Laid-open No. 54-14406. The composition contains d-limonene and surfactants, and is alleged to be useful to clean, for example, carpets or glass. Similar compositions which contain limonenes or pinenes as effective ingredients are also disclosed in Japanese Patent Laid-open Nos. 61-157596 and 61-183398.

Meanwhile, halogenated aliphatic hydrocarbons have been widely used as effective ingredients in cleaning compositions for industrial use, in particular, for removal of soldering fluxes in the fabrication of printed circuit or printed wiring boards.

In general, the soldering fluxes fall into two broad categories: water soluble fluxes and rosin fluxes. The water soluble fluxes usually contain strong acids and/or amine hydrohalides and are accordingly corrosive. Thus, if traces of residues remain on boards, premature circuit failure will result. For that reason, rosin fluxes are preferred in the fields where high durability or precision is required.

The rosin fluxes are non-corrosive. However, traces of residual rosin fluxes should be also removed carefully to prevent premature circuit failure on account of decreased board resistance. The water soluble fluxes may be readily removed from printed circuit boards with warm soap water, while halogenated aliphatic hydrocarbons such as 1,1,1-trichloroethane, trichlorofluoromethane, trichlorotrifluoroethane or mixtures of these have been heretofore used to remove the rosin fluxes from printed circuit boards following soldering.

However, the use of such halogenated hydrocarbons is causing a serious global environmental problem of ozone layer destruction, and now the use is stringently controlled and is being prohibited.

Therefore, there has been proposed a method of cleaning printed circuit or printed wiring boards to remove rosin soldering fluxes which employs a water base composition containing a terpene compound such as d-limonene or diterpene preferably together with a terepene emulsifying surfactant, as described in U.S. Pat. No. 4,640,719 to Hayes et al.

It is true that the above composition is effective to remove rosin fluxes or adhesive tape residues from printed circuit boards. But, since the terpene compounds used are natural products which are extracted from orange peel, stable supply thereof is attended at least to an extent by difficulty, and the quality is not fixed as a further defect. In addition, the terpene compounds are usually chemically unstable due to their rather active unsaturated bonds therein.

It is therefore a general object of the invention to provide a cleaning composition which is of high cleaning ability and safety but also of constant quality.

It is a further object of the invention to provide a method of removing rosin soldering fluxes, oils, waxes, greasy materials, adhesive tape residuals or the like from printed circuit boards or printed wiring boards during the fabrication of the boards.

In accordance with the invention, there is provided a cleaning composition which comprises dimethylcyclooctadienes.

Further in accordance with the invention, there is provided a method of cleaning printed circuit boards or printed wiring boards, which comprises: contacting the board with a composition comprising dimethylcyclooctadienes and 2-20% by weight of a surfactant; rinsing the board with water; and drying the board.

The dimethylcyclooctadienes used as effective ingredients in the cleaning composition of the invention are unsaturated cyclic compounds, but are much more chemically stable than the terpene compounds such as d-limonene. The dimethylcyclooctadienes are industrially prepared by dimerization of isoprene, and available, as industrial products, usually as mixtures mainly composed of 2,6-dimethyl-1,5-cyclooctadiene (I) and 2,5-dimethyl-1,5-cyclooctadiene (II).

(I)

(II)

The cleaning composition of the invention may essentially consist of the dimethylcyclooctadienes. When the composition is used as such, after the application of the composition to a substrate, the substrate may be rinsed with alcohol such as methanol, and then with water, and dried.

The cleaning composition of the invention preferably contains the dimethylcyclooctadienes and a surfactant so that it is removed from a substrate by rinsing or flushing with water after the application of the composition. The surfactant used is not specifically limited, but alkyl sulfates, alkyl phenol polyalkylene ethers or sulfosuccinates are preferably used. More specifically, there may be mentioned, for example, triethanolamine salt of lauryl sulfate, sodium lauryl sulfate or sodium salt of synthetic alcohol as alkyl sulfates, ethylene oxide and/or propylene oxide adduct to nonylphenol as alkyl phenol polyalkylene ethers, and sodium dioctyl sulfosuccinate as sulfosuccinates. These surfactants may be used singly or as mixtures of two or more.

The surfactant may be contained in amounts of 2-20% by weight, preferably in amounts of 5-15% by weight, based on the composition, the balance being the dimethylcyclooctadienes. However, some of the surfactants are available as aqueous solutions, so that the composition of the invention may contain water in a small amount. Further, the composition may contain a solubilizer agent such as isopropanols.

The composition of the invention which comprises the dimethylcyclooctadienes and surfactants is especially useful for removal of resin soldering fluxes, oils, waxes, greasy materials, adhesive tape residuals or the like from printed circuit boards or printed wiring boards during the fabrication of the boards.

The cleaning of printed circuit boards or printed wiring boards with the composition of the invention may be carried out in such any known manner as described in before mentioned U.S. Pat. No. 4,640,719. Accordingly, the composition may be applied to boards by immersion in dip tanks or by hand or mechanical brushing. Any of the commercially available printed circuit cleaning equipment may be utilized. The composition is applied to printed circuit boards or printed wiring boards usually at room temperature for a period usually from one minute to ten minuted, although not limited thereto. The composition may be applied at elevated temperatures, if desired.

The composition of the invention is most advantageously employed to remove rosin soldering fluxes from printed circuit boards or printed wiring boards. The baked rosin flux on the boards is put into contact with the composition for a sufficient period of time to solubilize the flux, followed by removal of the composition from the boards. When the composition consists essentially of the dimethylcyclooctadienes, the boards are contacted therewith, rinsed with alcohols and then with water. When the composition contains a surfactant, the boards may be directly rinsed with water to remove the composition therefrom. After removal of the composition as above set forth, the boards are dried with, for example, nitrogen or the air, to provide boards from which the rosin flux has been completely removed therefrom.

As above set forth, the cleaning composition of the invention contains dimethylcyclooctadienes as essential ingredients therein which are industrially produced using isoprene and are chemically stable, so that the composition is suppliable as an industrial product having a fixed quality and a high storage durability. It has a further advantage that it is capable of being used repeatedly.

Furthermore, the composition of the invention is of high cleaning ability, but also rinsed away with water when the composition contains a surfactant, and thus the composition is in particular useful for removal of rosin soldering fluxes from printed circuit or printed wiring boards during the fabrication thereof as well as oils, waxes, greasy materials, adhesive tape residuals or the like.

The invention will now be described more specifically with reference to examples, however, the invention is not limited thereto.

EXAMPLE 1

An amount of 87 parts by weight of dimethylcyclooctadienes, 2.5 parts by weight of an aqueous solution of triethanolamine salt of lauryl sulfate (40% in solid concentration) and 10.5 parts by weight of ethylene oxide/propylene oxide adduct to nonylphenol were mixed together to provide a cleaning composition of the invention.

Rosin soldering fluxes as shown in the Table 1 were spin coated over ten seconds at a rate of 1500 rpm on bare silicon wafers, and then baked at 300° C. for 30 minutes in an oven.

The wafers thus the fluxes coated and baked thereon were then immersed in the cleaning composition at 25° C. for two minutes in a tank, taken out thereof and rinsed with water, followed by drying with a nitrogen gas. The rate of decrease of the flux film was measured with a Dektak apparatus to evaluate flux removal efficacy. The results are shown in the Table 1.

Meanwhile, the wafers were immersed in the composition at room temperature for five minutes, rinsed with water and dried with nitrogen. The wafers were then extracted with a circulating solution of an aqueous solution of isopropanol, and the resistivity of the solution was measured until equilibrium was reached. The measurements showed that the equivalent NaCl contamination was below 1 $\mu$g-NaCl/cm$^2$ with respect to all the rosin fluxes shown in the Table 1.

COMPARATIVE EXAMPLE 1

The same wafers as above having the fluxes coated and baked thereon were immersed in Freon 113 for two minutes, rinsed with methanol and then water. The rate of decrease of the flux film was measured in the same manner as above. The results are shown in the Table 1.

TABLE 1

| Rosin Fluxes | Rate of Decrease of Flux Film (Å/min.) | |
|---|---|---|
| | The Composition | Freon 113 |
| P-550-5[1)] | 1584 | 7750 |
| GX-7[1)] | 8125 | 9875 |
| HI-15[1)] | 4200 | 2367 |
| PO-4000[2)] | 8375 | 8625 |

Notes:
[1)]Rosin flux from Asahi Kaken K.K.
[2)]Rosin flux from Senju Kinzoku K.K.

EXAMPLE 2

A rosin flux was coated on bare silicon wafers with a soldering iron, and baked at 300° C. for 30 minuted. Then the wafers were immersed in the same composition as in the Example 1 and Freon 113, respectively, at room temperature for one minute, followed by rinsing and drying in the same manner as in the Example 1. The residual amount of the flux on the wafers was measured. The results are shown in the Table 2.

Further, silicone oil was coated on bare silicon wafers with a soldering iron, and then dried. The wafers were then immersed in the same composition as in the Example 1 and Freon 113, respectively, at room temperature for one minute, followed by rinsing and drying in the same manner as in the Example 1. The residual amount of the silicone oil on the wafers was measured. The results are shown in the Table 2.

TABLE 2

| | Residual Amount (%) | |
|---|---|---|
| | The Composition | Freon 113 |
| Flux | 1 | 1 |
| Silicone Oil | 2 | 5 |

EXAMPLE 3

A device for a socket was mounted on a printed wiring board with a stand-off of 0 mm, 0.1 mm, 0.2 mm and 0.3 mm, respectively. The thus surface-mounted board was immersed in the same composition as in Example 1 at 30° C. without agitation over a period of 10 minutes. Thereafter, the board was taken out of the composition, rinsed with pure water and ultraviolet-dried.

The equivalent NaCl contamination on the surface of the board was determined with an Omega Meter Model 800 (registered trademark of Kenco Industries, Inc., U.S.A.) in accordance with MIL-P-28809A. The determination was also carried out with a board having no socket mounted thereon, namely, a board which had a flux coated and was then dried for two days. The results are shown in the Table 3.

TABLE 3

| Stand-off (mm) | Equivalent NaCl Contamination ($\mu g/in^2$) |
|---|---|
| 0 | 5.5 |
| 0.1 | 5.1 |
| 0.2 | 5.1 |
| 0.3 | 5.1 |
| (No socket) | 0.0 |

EXAMPLE 4

A single drop of a 10% by weight dispersion of p-octylphenyl-2-chloro-4-(p-heptylbenzoyloxy)benzoate, a liquid crystal, in isopropanol was added to the same composition as in the Example 1. The liquid crystal disappeared in 0.6 seconds.

When Freon 113 was used, the liquid crystal disappeared in 5.3 seconds.

EXAMPLE 5

A plastic specimen (3×50×50 mm) was immersed in the same cleaning composition as in the Example 1 at 50° C. for 24 hours. The specimen was rinsed with water, dried with gauze and increase in weight was measured. The results are shown in the Table 4.

TABLE 4

| Plastics | Increase in Weight (% by weight) |
|---|---|
| ABS | 0.08 |
| Polyacetal | 0.00 |
| Polymethyl methacrylate | 0.00 |
| Epoxy resin | 0.00 |
| Polytetrafluoroethylene | 0.00 |
| 66-Nylon | 0.14 |
| Polycarbonate | 0.07 |
| Polybutyl terephthalate | 0.02 |
| Polyethylene terephthalate | 0.00 |
| Polyethylene | 0.00 |
| Polypropylene | 0.00 |
| Polystyrene | (Dissolved) |
| Silicone | (Dissolved) |

What is claimed is:

1. A method of cleaning printed circuit boards or printed wiring boards, which comprises: immersing the board in a composition comprising dimethylcyclooctadienes and 2-20% by weight of a surfactant; rinsing the board with water; and drying the board.

2. The method as claimed in claim 1 wherein the dimethylcyclooctadienes are mixtures mainly composed of 2,6-dimethyl-1,5-cyclooctadiene and 2,5-dimethyl-1,5-cyclooctadiene.

3. The method as claimed in claim 1 wherein the surfactant is an alkylsulfate, an alkylphenol-polyalkylene ether or a sulfosuccinate.

4. The method as claimed in claim 1 wherein the composition contains a solubilizer.

* * * * *